United States Patent
Bengtsson (10) Patent No.: US 9,667,354 B2
(45) Date of Patent: May 30, 2017

(54) SITUATIONAL BASED COMMUNICATION

(71) Applicant: Sony Mobile Communications Inc., Tokyo (JP)

(72) Inventor: Henrik Bengtsson, Lund (SE)

(73) Assignees: Sony Corporation, Tokyo (JP); Sony Mobile Communicatiosn Inc., Tokyo (JP)

( * ) Notice: Subject to any disclaimer, the term of this patent is extended or adjusted under 35 U.S.C. 154(b) by 0 days.

(21) Appl. No.: 14/551,309

(22) Filed: Nov. 24, 2014

(65) Prior Publication Data
US 2016/0149649 A1 May 26, 2016

(51) Int. Cl.
| H04M 1/00 | (2006.01) |
|---|---|
| H04B 13/00 | (2006.01) |
| H04W 4/00 | (2009.01) |
| G01R 29/12 | (2006.01) |
| H04M 1/725 | (2006.01) |

(52) U.S. Cl.
CPC .......... H04B 13/005 (2013.01); G01R 29/12 (2013.01); H04M 1/72569 (2013.01); H04W 4/008 (2013.01)

(58) Field of Classification Search
CPC ........ G06F 3/041; G06F 3/0416; G06F 3/044; G06F 3/046; H04M 1/72522; H04M 1/72527; H04M 1/7253; H04M 2250/52; H04N 2007/145
USPC .................. 455/41.1, 41.2, 556.1; 340/572.7
See application file for complete search history.

(56) References Cited

U.S. PATENT DOCUMENTS

| 9,008,577 B2* | 4/2015 | Mine ..................... G06F 3/0488 455/161.3 |
|---|---|---|
| 2002/0003345 A1* | 1/2002 | Stanley .................. B60N 2/286 280/735 |
| 2004/0095252 A1* | 5/2004 | Kraljic ................... G08B 21/22 340/687 |
| 2009/0176544 A1* | 7/2009 | Mertens .................. A63F 13/02 463/5 |
| 2009/0189769 A1* | 7/2009 | Schaffler .............. G06K 7/0008 340/572.7 |
| 2009/0264068 A1* | 10/2009 | Washiro .............. H04M 1/7253 455/41.1 |
| 2010/0311326 A1* | 12/2010 | Klabunde ............ H04B 5/0012 455/41.1 |

(Continued)

FOREIGN PATENT DOCUMENTS

WO 2014001704 1/2014

OTHER PUBLICATIONS

U.S. Appl. No. 14/467,588, filed Aug. 25, 2014.

(Continued)

*Primary Examiner* — Edward Urban
*Assistant Examiner* — Max Mathew
(74) *Attorney, Agent, or Firm* — Tucker Ellis, LLP (57) ABSTRACT

The present disclosure provides for a method and a communication device comprising an Electric Field, EF, sensor and a communication circuitry for initiating situational based communication actions in the communication device. The method comprises detecting a change in the electric field surrounding the communication device using the EF sensor, determining that the change in the electric field has a predetermined characteristic and activating the communication circuitry depending on the determination.

18 Claims, 5 Drawing Sheets

(56) References Cited

U.S. PATENT DOCUMENTS

| | | | |
|---|---|---|---|
| 2012/0113051 A1* | 5/2012 | Bird | H04B 13/005 |
| | | | 345/174 |
| 2012/0235787 A1 | 9/2012 | Brient et al. | |
| 2013/0065523 A1* | 3/2013 | Yun | H04M 1/7253 |
| | | | 455/41.1 |
| 2014/0133669 A1 | 5/2014 | Klinghult et al. | |
| 2015/0020299 A1* | 1/2015 | Hsu | E03D 5/105 |
| | | | 4/313 |

OTHER PUBLICATIONS

"Introduction to the BodyCom Technology", URL: http://ww1.microchip.com/downloads/en/AppNotes/01391A.pdf, May 2, 2011, pp. 1-4.

"Capacitive sensors", SensorWiki.org, Mar. 20, 2013, URL:http://www.sensorwiki.org/doku.php/sensors/capacitive, pp. 2, 3.

International Search Report for International Application No. PCT/IB2015/053762 dated Sep. 18, 2015.

* cited by examiner

SITUATIONAL BASED COMMUNICATION

TECHNICAL FIELD

The present disclosure provides for a method and a communication device comprising an Electric Field, EF, sensor and communication circuitry for initiating situational based communication actions in the communication device.

BACKGROUND

Communication devices, such as mobile phones and tablet computers, have user inputs that are used in the control of the communication device. Exemplary user inputs include buttons and a touch sensitive display. Motion sensors (e.g., accelerometers) also may be used to control the communication device in response to certain movements. While these inputs generally perform very well, there remains room for improvement in the manner in which users interact with communication devices and for reducing power consumption by communication devices.

In addition to reducing power consumption, there is always a need to increase usability of communication devices. In other words, there is always a need to improve the experience of using a communication device. The experience can for example be improved by improving the functionality of the device so that the user can achieve more using the device or it can be improved by improving the functionality of the device so that the user does not have to provide input for all actions taken by the device.

SUMMARY

An object of the present disclosure is to provide a method and a device which uses an output from an Electric Field, EF, sensor to determine if a communication circuit should be activated and which seeks to mitigate, alleviate, or eliminate one or more of the above-identified deficiencies in the art and to provide a way for initiating situational based communication actions in the communication device.

These and further objects are achieved by the method and a communication device which utilizes an EF sensor for recognizing situations and which activates communication circuitry for certain situations.

The disclosure provides for methods and devices for initiating situational based communication actions in the communication device.

The present disclosure is defined by the appended claims. Various advantageous embodiments of the disclosure are set forth by the appended claims as well as by the following description and the accompanying drawings.

According to some aspects the disclosure provides for a method performed in a communication device comprising an Electric Field, EF, sensor and communication circuitry.

According to some aspects, the method comprises detecting a change in the electric field surrounding the communication device using the EF sensor, determining that the change in the electric field has a predetermined characteristic and activating the communication circuitry depending on the determination. Thus, the communication device activates a communication circuit if it is in a predetermined situation and a way to initiate automatic communication actions is provided. The method increases the usability of communication devices because it provides the device the ability to recognize predetermined situations and to initiate automatic actions based on the situations.

According to some aspects, the EF sensor produces an output signal representing the electric field around it and the determining comprises analysing the output signal. In other words, the signal from the EF sensor is analysed and the result determines if a communication circuitry is to be activated or not.

According to some aspects, the predetermined characteristic is indicative of a presence of a second person in addition to a user of the communication device. Thereby, communication between the communication device and a communication device of the second person may be initialized by the detection of the second person by the EF sensor. In some cases there is no user of the communication device; if for example the communication is a coffee machine. A coffee machine equipped with an EF sensor may activate communication circuitry when the signal from the EF sensor indicates that a person is standing in front of it. The communication circuitry is for example Body Coupled Communication, BCC, circuitry.

According to some aspects, the predetermined characteristic is indicative of a predetermined situation. There are many situations where this would be beneficial; for example when the user of the communication device enters a car. The characteristic then indicates this and the communication circuitry of the device is activated. The device may then for example communicate with the car with instructions to set the mirrors to a certain position or set the radio according to the user's preferences.

According to some aspects, activating the communication circuitry comprises activating Body Coupled Communication, BCC, in the communication device. Thus, some predetermined characteristics result in activation of BCC. An example is if a door is equipped with an EF sensor. The door activates BCC circuitry when it is detected that a person is near the door. The BCC technology may be used to exchange information between the door and a communication device of the person when the person touches the handle of the door. The information may be used to check if the person is authorised to enter.

According to some aspects, the method comprises scanning for a second communication device using BCC. An advantage of this is that the BCC circuitry does not need to be activated and consume power before the communication device is in a situation where BCC might be needed.

According to some aspects, the method comprises exchanging information between the communication device and the second communication device upon detection of the second communication device during the scanning. This is useful in situations where the user of the communication device for example shakes hand with another person. The EF sensor then detects the presence of a second person and activates BCC to see if the user and the second person touch each other. The BCC may then only be activated when a situation arises where a second person is present.

According to some aspects, activating (S4) the communication circuitry comprises activating one or more of Wi-Fi, IP communication, Bluetooth and/or Bluetooth Low Energy in the communication device. Depending on the determination of the predetermined characteristic different communication technologies may be activated.

According to some aspects, the method comprises continuously scanning for changes in the electric field surrounding the communication device using the EF sensor. Changes in the electric field are thus always monitored.

According to some aspects, the EF sensor is configured to be in constant contact with the body of a user. I.e. a static EF sensor is used. A static EF sensor is a passive sensor which uses very little power and thus the battery time for the device is very little affected by the sensor.

According to some aspects, the EF sensor is a static EF sensor, a transparent EF sensor, an active EF sensor, a passive capacitive sensor and/or an active capacitive sensor.

According to some aspects, the active EF sensor is configured to operate in any one or more of: load mode, transmit mode or shunt mode.

According to some aspects the disclosure provides for a communication device configured to initiate situational based actions, comprising an Electric Field, EF, sensor and processing circuitry.

According to some aspects, the processing circuitry is configured to detect a change in the electric field surrounding the communication device using the EF sensor, determine that the change in the electric field has a predetermined characteristic and activate the communication circuitry depending on the determination. The advantages have been previously discussed.

According to some aspects the disclosure provides for a computer readable program, which, when executed on a communication device, causes the communication device to perform the method according to above.

BRIEF DESCRIPTION OF THE DRAWINGS

The foregoing will be apparent from the following more particular description of the example embodiments, as illustrated in the accompanying drawings in which like reference characters refer to the same parts throughout the different views. The drawings are not necessarily to scale, emphasis instead being placed upon illustrating the example embodiments.

DETAILED DESCRIPTION

Aspects of the present disclosure will be described more fully hereinafter with reference to the accompanying drawings. The device and method disclosed herein can, however, be realized in many different forms and should not be construed as being limited to the aspects set forth herein.

The terminology used herein is for the purpose of describing particular aspects of the disclosure only, and is not intended to limit the invention. As used herein, the singular forms "a", "an" and "the" are intended to include the plural forms as well, unless the context clearly indicates otherwise.

Embodiments of the present invention will be exemplified using a communication device such as a mobile phone. However, it should be appreciated that the invention is as such equally applicable to any communication devices which have communication capabilities. Examples of such devices may for instance be any type of mobile phone, smartphone, laptop (such as standard, ultra portables, netbooks, and micro laptops), handheld computers, portable digital assistants, tablet computers, touch pads, gaming devices, accessories to mobile phones, e.g. wearables in the form of headphones/-sets, visors/goggles, bracelets, wristbands, necklaces, watches, headbands, rings, etc. It should be noted that a communication device is any communication device equipped with communication means and can be e.g. a coffee machine, a lamp post or a door.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Body-Coupled Communications, BCC, also referred to as Body-Based Communication, BBC or Near-Body Communication, NBC, has been proposed as a promising alternative to radio frequency, RF, communication as a basis for Body/Personal Area Network, BAN/PAN, communication. BCC allows for an exchange of information between a plurality of devices which are in contact with or in close proximity of a living body. This can be achieved by the transmitting BCC-/BAN-antenna that provides a capacitive or galvanic coupling of low-energy electrical fields onto the body surface, i.e. leakage currents with a small magnitude is set to spread out over the human body. The small currents are then detected by a receiver BCC-/BAN-antenna, located on the same body. Thus, signals are conveyed over the body instead of through the air. As such, the communication is confined to the volume close to the body in contrast to RF communications, where a much larger volume is covered. Therefore, communication is possible between devices situated on, connected to, or placed close to the body. The power consumption of BCC-/BAN-antennas is very low.

BCC/BBC is no new technique, and it has previously been employed within the fields of e.g. medical sensor devices and exercise sensors. Within these fields, sensors attached to the users skin or worn in the close proximity of the body is employed for monitoring different body functions in order to keep track of medical status or fitness parameters of the user. To send the collected data to a central unit e.g. BCC/BBC can be utilized.

The present disclosure propose a method performed in a communication device 1 comprising an Electric Field, EF, sensor 2 and communication circuitry 3. The communication device also comprises processing circuitry 4 and a memory 5. The communication device 1 can be denoted as the first communication device 1.

Figure 1:
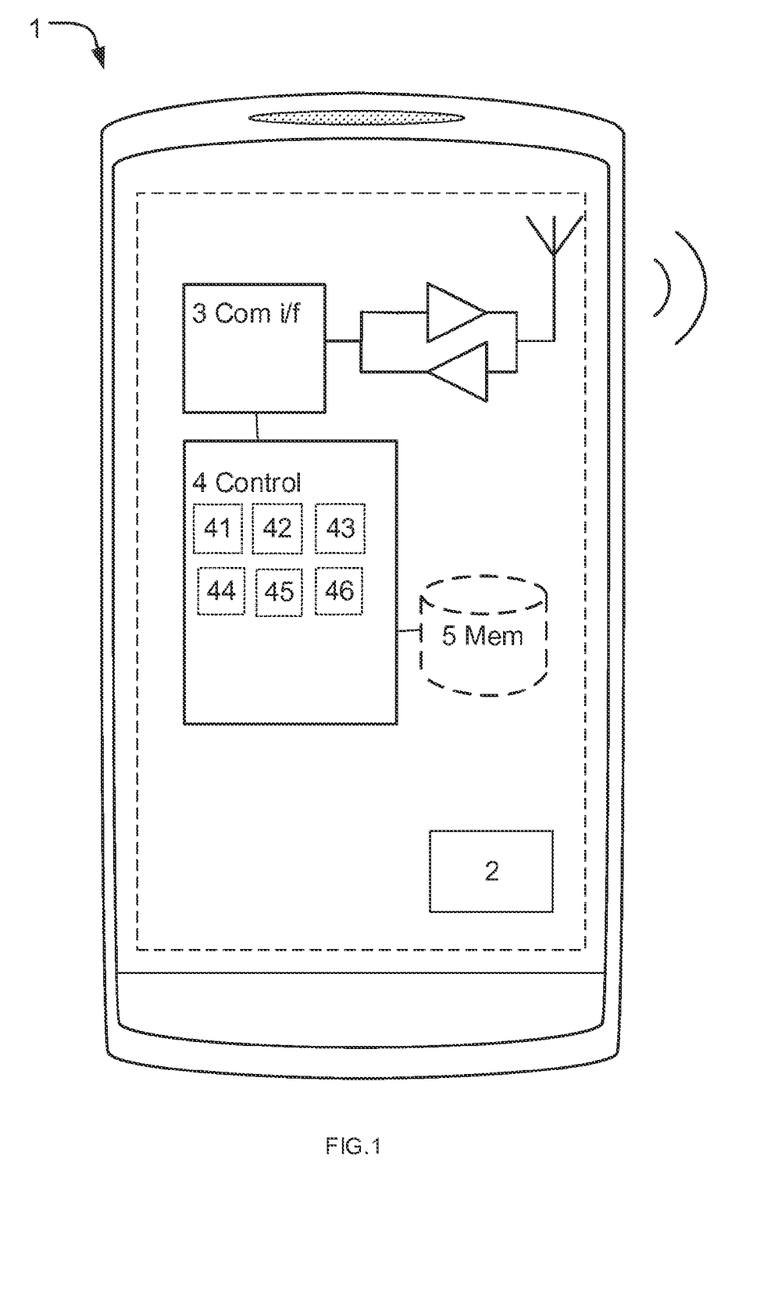
FIGS. 1-6 illustrates examples of communication devices.
Figure 2:
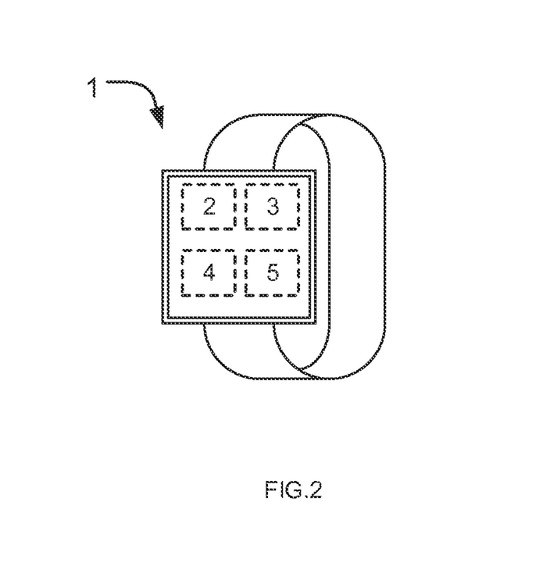
Figure 3:
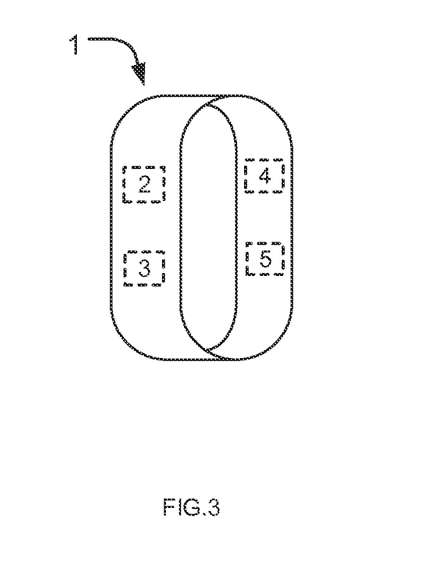
Figure 4:
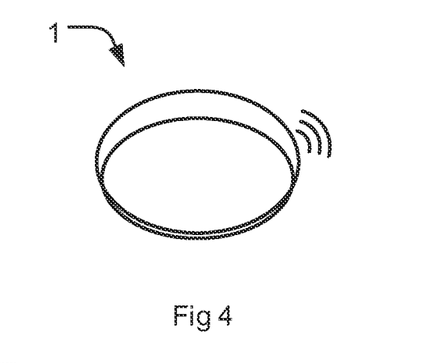
Figure 5:
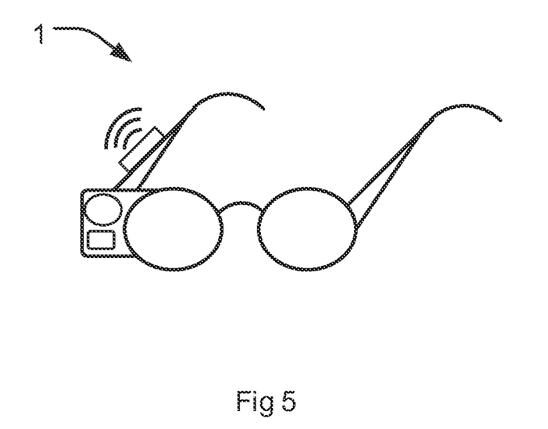
Figure 6:
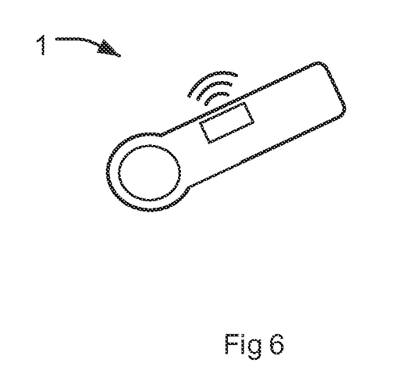

FIGS. 1, 2 and 3 illustrate examples of communication devices 1. In FIG. 1 the communication device is illustrated as a smartphone, and in FIG. 2 the communication device is illustrated as a wearable device, such as a watch. According to some aspects, the communication device comprises a touch screen; that is not the case if the communication device is a type of wearable without a touch screen, such as a wristband as shown in FIG. 3. FIGS. 4, 5 and 6 illustrate other examples of communication devices. FIG. 4 shows a ring, FIG. 5 shows glasses and FIG. 6 shows an earpiece.

Figure 7:
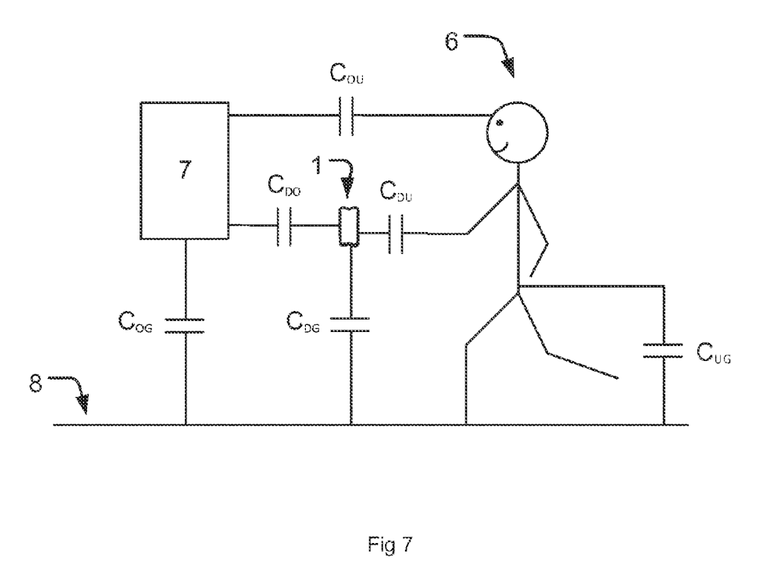
FIGS. 7 and 8 illustrates Electric Field sensing around a user.

With reference to FIG. 7; illustrated is a schematic block diagram of an exemplary communication device 1 in an operational environment. The illustrated exemplary operational environment includes a user 6 of the communication device and another object 7. Various electrical and magnetic fields are present around the communication device. These fields are generally generated by the flow of alternating current in cables, appliances, communication devices, etc.

In addition to fields generated by alternating current, static electric fields are also present. The static field strength (or voltage potential) between two objects is dependent on the materials making up the objects, the relative position of the objects from one another, the distance between the objects, the relative movement between the objects, and any electrical connection or coupling to other objects in the environment. To represent this electrical environment, a capacitance between each pair of objects in FIG. 7 is schematically illustrated. Each item has a capacitance relative to a ground plane 8, indicated by $C_{UG}$ for the capacitance between the user 6 and the ground plane, by $C_{DG}$ for the capacitance between the communication device 1 and the ground plane, and by $C_{OG}$ for the capacitance between the object and the ground plane. Also, each item has a capacitance relative to each other, indicated by $C_{DU}$ for the capacitance between the communication device and the user, by $C_{DO}$ for the capacitance between the communication device and the object, and by $C_{OU}$ for the capacitance between the object and the user.

Across each of these capacitances, a static electric field may be present. The electric field between any two of the objects in the environment may change. Thus, the total electric field as detectable at the communication device may change. These changes are for example due to movement of the user 6 relative to the communication device 1, movement of the object 7 relative to the communication device, and/or movement of the user relative to the object. The movements that cause changes in the detectable electric field may be large scale movements, such as the user walking past the communication device, or relatively small scale movements, such as the user moving an arm in a reaching motion to pick up the communication device. Changes in energy consumption by nearby electrical devices such as lights, appliances, and machines, also may result in changes in the electric field strength detectable by the communication device.

Thus, it will be understood that materials and objects in an environment with electrical fields have voltage potentials towards other objects in the surrounding environment. More specifically, as soon as there is a voltage potential or current flowing near the communication device 1, there will be an electrical field or fields generated in the location of the communication device. But the detectable electric field strength is affected by varying voltage potentials between objects, and those potentials change depending on factors such as user body size, user movement (e.g., walking, raising or lowering an arm, etc.) and other factors.

Figure 8:
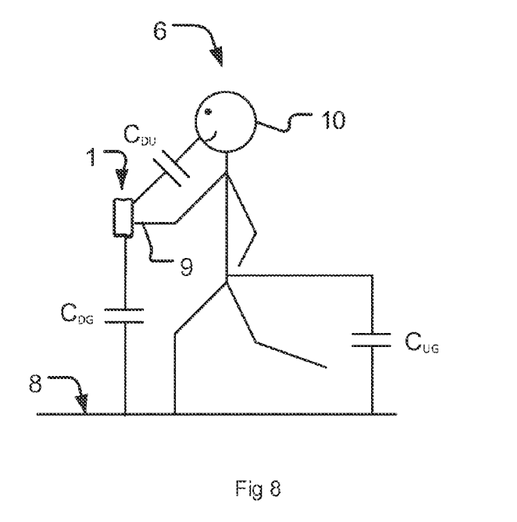

In FIG. 7, the user 6 is depicted as not touching the communication device 1. With additional reference to FIG. 8, the user is depicted as touching the communication device with the user's hand 9 (e.g., the user is holding the communication device in her/his hand). But an electric field measurable by the communication device may still be affected by the distance between a part of the user and the communication device.

A relatively simple way of implementing an EF sensor and measuring electrical fields includes using a standard radio receiver used to receive broadcast transmissions (e.g., AM or FM transmissions). Another embodiment of implementing the EF sensor and measuring electrical fields includes using an antenna and a sensing circuit. The power consumption of an EF sensing function implemented in one of these manners is relatively low (e.g., as low as a couple of milliwatt). According to some aspects the EF sensor includes an EF antenna, a voltage meter (also referred to as a voltmeter) and/or a capacitor (e.g. capacitor implemented with a physical circuit component). The capacitor has a first pole connected to the EF antenna and a second pole connected to a reference potential on a circuit board of the communication device. The voltage meter measures the voltage across the capacitor and outputs an analog electrical signal indicative of variations in the electric field surrounding the communication device. The analog signal from the voltmeter may be converted to a digital signal using an analog to digital (A/D) converter. The digital signal may be analysed using digital signal processing and statistical analysis to identify and classify features and variations of the sensed electric field. Continuous or periodic scanning of the EF environment may be made with relative low power consumption (e.g., up to a few milliwatt). EF sensing may consume as little as 1.8 microAmps for sensing activity. Therefore, application of the EF sensor may be made in wearable and portable communication devices that typically operate using power from rechargeable batteries.

Figure 9:
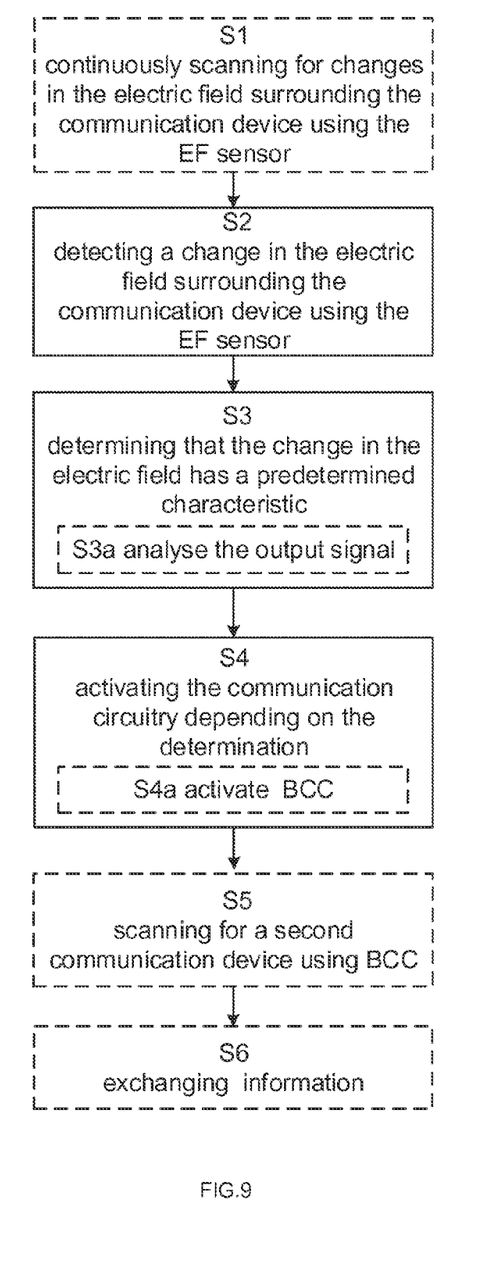
FIG. 9 is a flow chart illustrating the proposed method, performed in the communication device.

FIG. 9 is a flow diagram depicting example operations which may be taken by the communication device of FIGS. 1-6.

It should be appreciated that FIG. 9 comprises some operations which are illustrated with a solid border and some operations which are illustrated with a dashed border. The operations which are comprised in a solid border are operations which are comprised in the broadest example embodiment. The operations which are comprised in a dashed line are example embodiments which may be comprised in, or a part of, or are further operations which may be taken in addition to the operations of the broader example embodiments. It should be appreciated that the operations need not be performed in order. Furthermore, it should be appreciated that not all of the operations need to be performed.

The proposed technique will now be described referring to FIGS. 1-9. As previously discussed, the disclosure provides for a method and device for initiating situational based communication actions in the communication device 1.

The method comprises detecting S2 a change in the electric field surrounding the communication device 1 using the EF sensor 2. The processing circuitry 4 is configured to detect the change using the EF sensor. According to some aspects, the processing circuitry comprises a detector 42 for detecting the change. EF sensing has been previously described. To detect a change in the electric field is for example to detect if an output signal from the EF sensor is changed more than a threshold value. EF sensors detect electrical energy and/or energy density and/or changes in the electrical energy and/or changes in energy density.

The method further comprises determining S3 that the change in the electric field has a predetermined characteristic. The processing circuitry 4 is configured to determine that the change in the electric field has a predetermined characteristic. According to some aspects, the processing circuit comprises a determiner 43 for the determination. The predetermined characteristic is one or several characteristics which has been determined before use of the method.

According to some aspects, the EF sensor produces an output signal representing the electric field around it and the determining S3 comprises analysing S3a the output signal. To analyse the output signal can be performed in many different ways. One example is to compare the output signal to one or more reference signals. Another example is to analyse the signal mathematically after converting the output signal to a digital signal. Another example is to use filters for the analysis. Methods for analysing a signal are known to the skilled person and will not be described further. The predetermined characteristic is stored in a format so that it is comparable to the output signal. The predetermined characteristic is for example a reference signal.

The method further comprises activating S4 the communication circuitry depending on the determination. The processing circuitry 4 is configured to activate the communication circuitry. According to some aspects, the processing circuit comprises an activator 44 for the activation. Thus, the communication device activates a communication circuit if it is in a predetermined situation and a way to initiate automatic communication actions is provided. In other words, the determination triggers the activation of communication circuitry in the communication device. The method increases the usability of communication devices because it provides the device the ability to recognize predetermined situations and to initiate automatic actions based on the situations.

In other words, the signal from the EF sensor is analysed and the result determines if a communication circuitry is to be activated or not.

The predetermined characteristic can be many different characteristics and different characteristics can activate different communication circuits. According to some aspects, the predetermined characteristic is indicative of a presence of a second person in addition to a user of the communication device. Thereby, communication between the communication device and a communication device of the second person may be initialized by the detection of the second person by the EF sensor. In some cases there is no user of the communication device; if for example the communication is a coffee machine. A coffee machine equipped with an EF sensor may activate communication circuitry when the signal from the EF sensor indicates that a person is standing in front of it. In this case the predetermined characteristic is indicative of a person in the vicinity of the communication device. The communication circuitry is for example Body Coupled Communication, BCC, circuitry. The presence of a second person here means that a second person is so close to the communication device so that the communication device can recognise the second person using the EF sensor. In other words, the characteristic of the EF sensor is determined to match a characteristic indicating the presence of a second person.

Another example is that the predetermined characteristic is indicative of a predetermined situation. There are many situations where this would be beneficial; for example when the user of the communication device enters a car. The characteristic then indicates this and the communication circuitry of the device is activated. The device may then for example communicate with the car with instructions to set the mirrors to a certain position or set the radio after the user's preferences. Another example is when the predetermined characteristic is associated with a situation like the user of the communication device standing in front of a coffee vending machine. According to some aspects, the user of the communication device records the predetermined characteristics. In other words, the user may place himself/herself in a specific situation and record the output from the EF field in that situation. The recording is thereafter used as a predetermined characteristic to determine when the user is in the same situation.

As previously discussed, according to some aspects, activating S4 the communication circuitry comprises activating S4a Body Coupled Communication, BCC, in the communication device. Thus, some predetermined characteristics results in activation of BCC. An example is this is if a door is equipped with an EF sensor. The door activates BCC circuitry when it is detected that a person is near the door. The BCC technology may be used to exchange information between the door and a communication device of the person when the person touches the handle of the door. The information may be used to check if the person is authorised to enter.

The method comprises, according to some aspects, scanning S5 for a second communication device using BCC. The processing circuitry 4 is configured to scan for the second device. According to some aspects, the processing circuit comprises a scanner 45 for the scan. The scan for another device comprises to ping for another device. An advantage of this is that the BCC circuitry does not need to be activated and consume power before the communication device is in a situation where this might be needed.

Upon detection of the second communication device during the scanning S5, the method comprises, according to some aspects, exchanging S6 information between the communication device and the second communication device. The processing circuitry 4 is configured to exchange the information. According to some aspects, the processing circuit comprises an exchanger 46 for the exchange. This is useful in situations where the user of the communication device for example shakes hand with someone. The EF sensor then detects the presence of a second person and activates BCC to see if the user and the second person touch. The BCC is then only activated when a situation arises where a second person is present. The information exchanged is for example hand shake information to couple the devices. The information is for example contact information of the users of the two communication devices, the contact information may be in the form of electronic business cards. Contact information is for example e-mail, address and/or name. According to some aspects, the time of the information exchange is recorded. A user can then see at what time he/she met who. In the case when the communication device is a door and the second communication device is a Smartphone of a user, the information is for example to send identifying information of the user to the door to let the door know that it is a person who is allowed to enter the door.

In other words, if user A has a Smartphone using the method in the pocket, and user B has a Smartphone in the pocket, and user A touches (or shakes) the hand of user B, the change of electric field is detected. Then the Smartphone of A (or B) signals to the other phone, with for example its name and the other side responds (if it has not already sent) with name.

Activating S4 the communication circuitry comprises, according to some aspects, activating one or more of Wi-Fi, IP communication, Bluetooth and/or Bluetooth Low Energy in the communication device. Depending on the determination of the predetermined characteristic different communication technologies may be activated. To activate the communication circuit comprises to activate any type of wireless communication. The predetermined characteristic is for example indicative of that the communication device has entered a specific room and then Wi-Fi is activated. The predetermined characteristic is for example indicative of that the communication device has been put on top of a computer and then Bluetooth is activated. The communication circuitry may be any type of communication technology.

The method comprises, according to some aspects, continuously scanning S1 for changes in the electric field surrounding the communication device using the EF sensor. The processing circuitry 4 is configured to scan for changes using the EF sensor. According to some aspects, the processing circuit comprises a scanner 41 for the scan. Changes in the electric field are thus always monitored.

According to some aspects, the EF sensor is configured to be in constant contact with the body of a user. I.e. a static EF sensor is used. A static EF sensor is a passive sensor which uses very little power and thus the battery time for the device is increased. Thus, a way to wake up communication circuits is provided which consumes very little power. The communication circuits of a communication device is often one of the big power consumers of the device and by activating the circuits when it is probable that the device is in a situation where it is needed, power can be saved.

According to some aspects, the EF sensor is a static EF sensor, a transparent EF sensor, an active EF sensor, a passive capacitive sensor and/or an active capacitive sensor. With active field sensing a field is actively emitted and the distortion is measured. Passive field sensing leverages special features or the distortion of already present electric fields in the environment. The choice of EF sensor is a design choice and will affect the characteristic of the signal from the sensor. The predetermined characteristic is different depending on what EF sensor is used.

According to some aspects, the active EF sensor is configured to operate in any one or more of: load mode, transmit mode or shunt mode. Mainly three different methods are used for active field sensing: loading mode, shunt mode and transmit mode. These methods use different combinations of emitting and sensing electrodes to determine distance, movement and orientation of a human body.

In some implementations and according to some aspects of the disclosure, the functions or steps noted in the blocks can occur out of the order noted in the operational illustrations. For example, two blocks shown in succession can in fact be executed substantially concurrently or the blocks can sometimes be executed in the reverse order, depending upon the functionality/acts involved. Also, the functions or steps noted in the blocks can according to some aspects of the disclosure be executed continuously in a loop.

The description of the example embodiments provided herein have been presented for purposes of illustration. The description is not intended to be exhaustive or to limit example embodiments to the precise form disclosed, and modifications and variations are possible in light of the above teachings or may be acquired from practice of various alternatives to the provided embodiments. The examples discussed herein were chosen and described in order to explain the principles and the nature of various example embodiments and its practical application to enable one skilled in the art to utilize the example embodiments in various manners and with various modifications as are suited to the particular use contemplated. The features of the embodiments described herein may be combined in all possible combinations of methods, apparatus, modules, systems, and computer program products. It should be appreciated that the example embodiments presented herein may be practiced in any combination with each other.

It should be noted that the word "comprising" does not necessarily exclude the presence of other elements or steps than those listed and the words "a" or "an" preceding an element do not exclude the presence of a plurality of such elements. It should further be noted that any reference signs do not limit the scope of the claims, that the example embodiments may be implemented at least in part by means of both hardware and software, and that several "means", "units" or "devices" may be represented by the same item of hardware.

The various example embodiments described herein are described in the general context of method steps or processes, which may be implemented according to some aspects by a computer program, comprising computer readable code which, when run on a communication device, causes the communication device to perform the method according to above. The computer program, embodied in a computer-readable medium, includes computer-executable instructions, such as program code, executed by computers in networked environments. A computer-readable medium may include removable and non-removable storage devices including, but not limited to, Read Only Memory, ROM, Random Access Memory, RAM, compact discs, CDs, digital versatile discs, DVD, etc. Generally, program modules may include routines, programs, objects, components, data structures, etc. that performs particular tasks or implement particular abstract data types. Computer-executable instructions, associated data structures, and program modules represent examples of program code for executing steps of the methods disclosed herein. The particular sequence of such executable instructions or associated data structures represents examples of corresponding acts for implementing the functions described in such steps or processes.

In the drawings and specification, there have been disclosed exemplary embodiments. However, many variations and modifications can be made to these embodiments. Accordingly, although specific terms are employed, they are used in a generic and descriptive sense only and not for purposes of limitation, the scope of the embodiments being defined by the following claims.

The invention claimed is:

1. A method performed in a communication device comprising an Electric Field (EF) sensor and a communication circuitry, for initiating situational based communication actions in the communication device, the method comprising:
storing, on the communication device, data that represents one or more predetermined characteristic of an electric field;
monitoring, with the EF sensor, an electric field surrounding the communication device;
analyzing an output from the EF sensor that represents one or more characteristics of the monitored electric field surrounding the communication device to detect a changed characteristic in the one or more characteristics of the electric field surrounding the communication device;
evaluating the detected changed characteristic in the one or more characteristics of the electric field surrounding the communication device with respect to the stored data that represents the predetermined characteristic of the electric field;
determining, based on the evaluation, that the detected changed characteristic matches the predetermined characteristic; and
activating the communication circuitry based on the determination.

2. The method according to claim 1, wherein the predetermined characteristic is indicative of a presence of a second person in addition to a user of the communication device.

3. The method according to claim 1, wherein the predetermined characteristic is indicative of a predetermined situation.

4. The method according to claim 1, wherein activating the communication circuitry comprises activating Body Coupled Communication, BCC, in the communication device.

5. The method according to claim 4, comprising:
scanning for a second communication device using BCC.

6. The method according to claim 5, comprising:
exchanging information between the communication device and the second communication device upon detection of the second communication device during the scanning.

7. The method according to claim 1, wherein activating the communication circuitry comprises activating one or more of Wi-Fi, IP communication, Bluetooth and/or Bluetooth Low Energy in the communication device.

8. The method according to claim 1, wherein the EF sensor is configured to be in constant contact with the body of a user.

9. The method according to claim 1, wherein the EF sensor is a static EF sensor, a transparent EF sensor, an active EF sensor, a passive capacitive sensor and/or an active capacitive sensor.

10. The method according to claim 9, wherein the active EF sensor is configured to operate in any one or more of: load mode, transmit mode or shunt mode.

11. A communication device configured to initiate situational based actions, comprising:
   an Electric Field (EF) sensor;
   a memory that stores data that represents predetermined characteristics of an electric field; and
   processing circuitry configured to:
      monitor, with the EF sensor, an electric field surrounding the communication device;
      analyze output from the EF sensor that represents one or more characteristics of the monitored electric field surrounding the communication device to detect changed characteristic in the one or more characteristics of the electric field surrounding the communication device;
      evaluate the detected changed characteristic in the one or more characteristics of the electric field surrounding the communication device with respect to the stored data that represents the predetermined characteristics of the electric field;
      determine, based on the evaluation, that the detected changed characteristic matches the predetermined characteristic; and
      activate the communication circuitry based on the determination.

12. The communication device according to claim 11, wherein the EF sensor is a static EF sensor, a transparent EF sensor, an active EF sensor, a passive capacitive sensor and/or an active capacitive sensor.

13. The communication device according to claim 11,
   wherein the predetermined characteristic is indicative of a presence of a second person in addition to a user of the communication device, or
   wherein the predetermined characteristic is indicative of a predetermined situation.

14. The communication device according to claim 11, wherein the processing circuitry is configured to activate by activating Body Coupled Communication, BCC, in the communication device.

15. The communication device according to claim 14, wherein the processing circuitry is configured to:
   scan for a second communication device using BCC; and
   exchange information between the communication device and the second communication device upon detection of the second communication device during the scanning.

16. The communication device according to claim 11,
   wherein the EF sensor is configured to be in constant contact with the body of a user; and
   wherein the active EF sensor is configured to operate in any one or more of: load mode, transmit mode or shunt mode.

17. The method according to claim 1, wherein storing data that represents one or more predetermined characteristic includes monitoring the electric field and recording an output from the electric field, the recorded output being the predetermined characteristic.

18. The communication device according to claim 11, wherein the processing circuitry is configured to monitor the electric field and record an output from the electric field, the recorded output being the predetermined characteristic stored in the memory.

* * * * *